US012740345B2

(12) United States Patent
Miyashita

(10) Patent No.: US 12,740,345 B2
(45) Date of Patent: Sep. 15, 2026

(54) METHOD OF MANUFACTURING SEMICONDUCTOR DEVICE

(71) Applicant: SUMITOMO ELECTRIC DEVICE INNOVATIONS, INC., Kanagawa (JP)

(72) Inventor: Kohei Miyashita, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 489 days.

(21) Appl. No.: 17/820,059

(22) Filed: Aug. 16, 2022

(65) Prior Publication Data

US 2023/0063697 A1 Mar. 2, 2023

(30) Foreign Application Priority Data

Aug. 30, 2021 (JP) ................................ 2021-140114

(51) Int. Cl.
*H10P 14/20* (2026.01)

(52) U.S. Cl.
CPC ...... *H10P 14/3216* (2026.01); *H10P 14/3416* (2026.01)

(58) Field of Classification Search
CPC ........... H01L 21/02458; H01L 21/0254; H01L 21/02378; H01L 21/02494; H01L 21/0262; H01L 21/02645; H01L 29/2003; H01L 29/41766; H01L 29/66462; H01L 29/7786
See application file for complete search history.

(56) References Cited

U.S. PATENT DOCUMENTS 6,606,335 B1 * 8/2003 Kuramata ................ H01S 5/32 372/45.01
2005/0167683 A1 * 8/2005 Lee ........................ C30B 25/18 257/E21.121
2006/0060866 A1 * 3/2006 Tezen ............... H10H 20/01335 257/E21.119
2010/0275836 A1 11/2010 Sato et al.
2012/0061683 A1 * 3/2012 Toba ................ H01L 21/02664 257/77
2012/0326165 A1 12/2012 Nakata et al.
2015/0287884 A1 10/2015 Higashihara et al.
2015/0372190 A1 * 12/2015 Hirayama .............. H01L 33/20 438/46
2018/0337306 A1 11/2018 Matsumoto et al.
2018/0363164 A1 * 12/2018 Schowalter .......... C30B 29/403
2019/0040546 A1 * 2/2019 Noguchi ............ H01L 21/0254

FOREIGN PATENT DOCUMENTS

CN 104911713 A * 9/2015
JP 2009-167053 7/2009
JP 2013-004924 1/2013
WO WO-2012128378 A1 * 9/2012 .............. C30B 9/12
WO 2014/098261 6/2014
WO 2017/082126 5/2017
WO WO-2021070910 A1 * 4/2021 ............ C30B 29/38

* cited by examiner

*Primary Examiner* — Eliseo Ramos Feliciano
*Assistant Examiner* — Timothy Edward Duren
(74) *Attorney, Agent, or Firm* — IPUSA, PLLC

(57) ABSTRACT

A method of manufacturing a semiconductor device includes forming a first AlN layer on a first main surface of a single-crystal substrate, partly etching the first AlN layer to form a plurality of pieces of AlN seed crystals on the first main surface from the first AlN layer, and forming a second AlN layer on the first main surface using the AlN seed crystals as growth nuclei.

7 Claims, 9 Drawing Sheets

START
S11
PLACING IN FILM FORMATION CHAMBER
S12
FORMING OF FIRST AlN LAYER
S13
FORMING OF AlN SEED CRYSTALS BY ETCHING FIRST AlN LAYER
S14
FORMING OF SECOND AlN LAYER
S15
FORMING OF ELECTRON TRANSIT LAYER, ELECTRON SUPPLY LAYER, AND CAP LAYER
S16
UNLOADING FROM FILM FORMATION CHAMBER
S17
FORMING OF ELECTRODE AND PASSIVATION LAYER
END 11
10

FIG.9
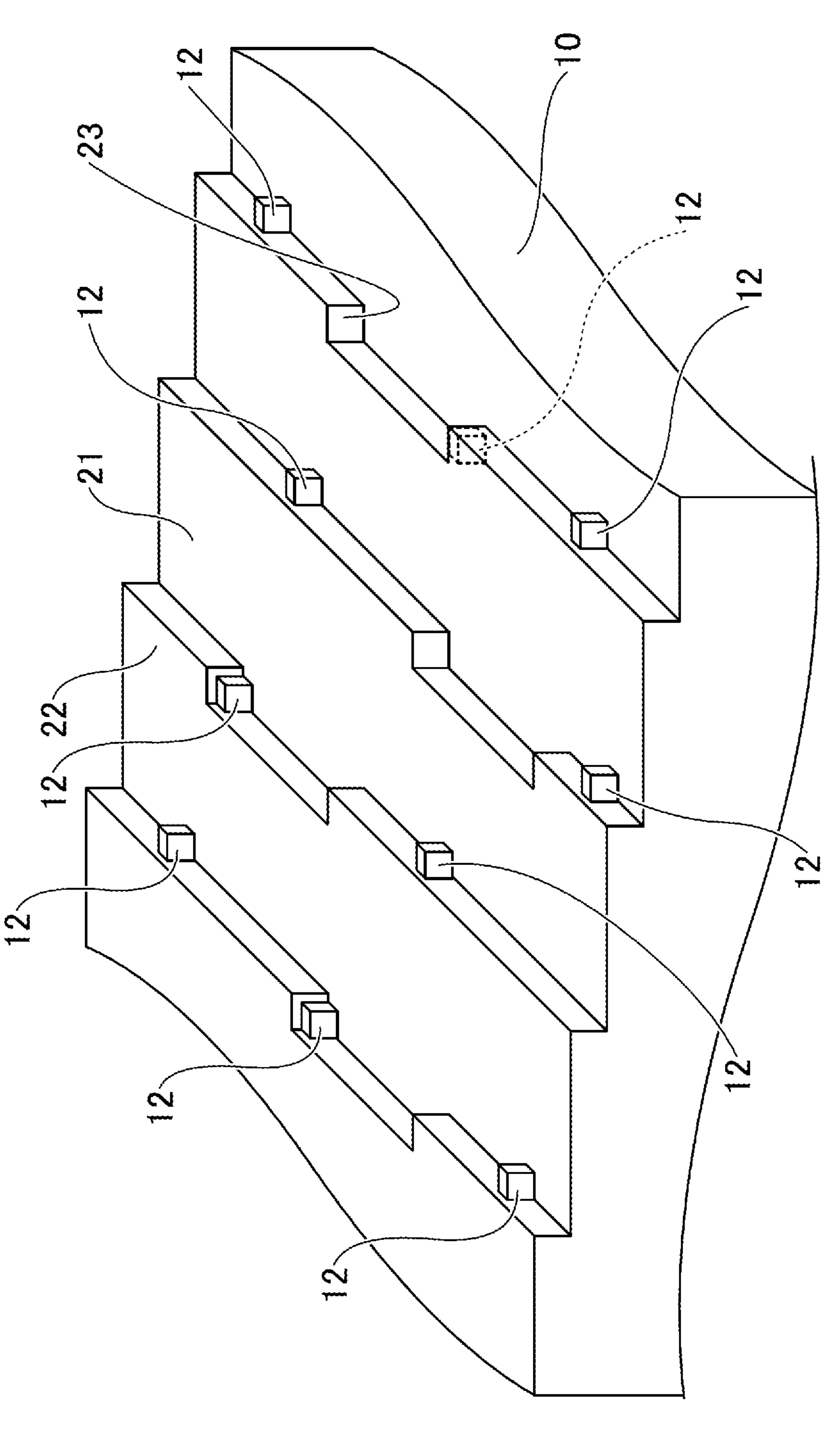
12
23
10
12
12
12
21
22
12
12
12
12
12
12

METHOD OF MANUFACTURING SEMICONDUCTOR DEVICE

CROSS REFERENCE TO RELATED APPLICATIONS

This application is based on and claims priority to Japanese Patent Application No. 2021-140114 filed on Aug. 30, 2021, the entire contents of which are incorporated herein by reference.

TECHNICAL FIELD

The present disclosure relates to a method of manufacturing a semiconductor device.

BACKGROUND

A method of manufacturing a semiconductor device known in the art forms an AlN buffer layer having an uneven upper surface on an SiC substrate, and then forms semiconductor layers such as an electron transit layer and an electron supply layer on the AlN buffer layer.

[Patent Document 1] Japanese Unexamined Patent Application Publication No. 2013-004924

SUMMARY

A method of manufacturing a semiconductor device according to the present disclosure includes forming a first MN layer on a first main surface of a single-crystal substrate, forming a plurality of pieces of AlN seed crystals on the first main surface from the first AlN layer by etching a portion of the first MN layer; and forming a second MN layer on the first main surface using the AlN seed crystals as growth nuclei.

BRIEF DESCRIPTION OF THE DRAWINGS

FIG. 9 is a schematic view (part 3) showing the formation process of the AlN buffer layer in the first embodiment.

DETAILED DESCRIPTION

Figure 1:
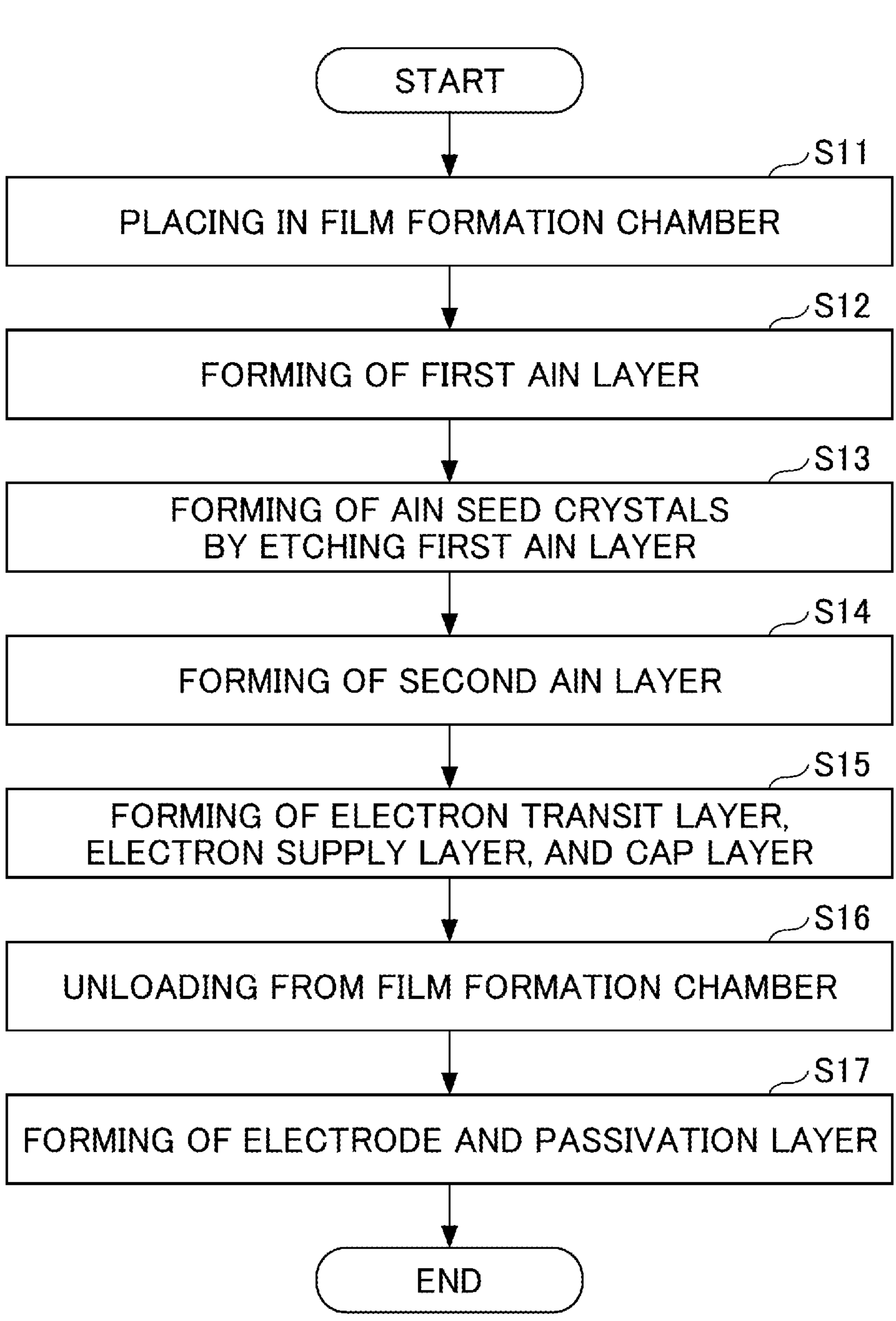
FIG. 1 is a flow chart showing a method of manufacturing a semiconductor device according to a first embodiment.

Problems to be Solved by the Invention

Various applications of semiconductor devices using nitride semiconductors have been studied. In some applications, it is desired to further reduce crystal defects such as pits in the nitride semiconductor layer.

An object of the present disclosure is to provide a method of manufacturing a semiconductor device capable of reducing crystal defects.

Description of Embodiments of the Present Disclosure

First, embodiments of the present disclosure will be listed and described.

(1) A method of manufacturing a semiconductor device includes forming a first MN layer on a first main surface of a single-crystal substrate, partly etching the first MN layer to form a plurality of pieces of AlN seed crystals on the first main surface from the first AlN layer, and forming a second AlN layer on the first main surface using the AlN seed crystals as growth nuclei.

A plurality of pieces of AlN seed crystals are formed by forming and etching a first AlN layer. Then, a second AlN layer is formed using the AlN seed crystals as growth nuclei. Thus, crystal defects in the semiconductor layer formed on the second MN layer can be reduced.

(2) In (1), a nitride semiconductor layer containing Ga may be formed on the second MN layer. In this case, a GaN-based semiconductor device is obtained.

(3) In (1) or (2), in the forming a first AlN layer, the first main surface may be entirely covered with the first AlN layer. In this case, it is easy to uniformly disperse the AlN seed crystals on the first main surface.

(4) In (1) to (3), the forming a first AlN layer may include supplying a trimethylaluminum gas, an ammonia gas, and a hydrogen gas into a film formation chamber, and the etching the first MN layer may include partly sublimating the first AlN layer by stopping supply of the trimethylaluminum gas into the film formation chamber while maintaining supply of the hydrogen gas into the film formation chamber at a temperature of 1000° C. to 1200° C. In this case, both the forming and the etching of the first AlN layer can be performed in a common film formation chamber.

(5) In (4), in the etching the first AlN layer, supply of the ammonia gas into the film formation chamber may be maintained. When ammonia gas is used to form the second AlN layer, the flow rate of ammonia gas can be easily stabilized by continuing the supply of ammonia gas.

(6) In (1) to (3), the etching the first MN layer may include partly removing the first AlN layer by dry-etching the first AlN layer using a hydrogen chloride gas at a temperature of 850° C. to 1100° C. In this case, it is easy to etch the first AlN layer in a short time.

(7) In (1) to (6), an average height of the AlN seed crystals may be 2.0 times or less an average height of steps present on the first main surface. In this case, it is easy to reduce variations in the size of the AlN seed crystal.

(8) In (1) to (7), the single-crystal substrate may be an SiC single-crystal substrate. In this case, a semiconductor layer having favorable crystallinity is easily formed.

(9) A method of manufacturing a semiconductor device includes forming a first AlN layer on a first main surface of an SiC single-crystal substrate, partly etching the first AlN layer to form a plurality of pieces of MN seed crystals on the first main surface from the first AlN layer, forming a second AlN layer on the first main surface using the AlN seed crystals as growth nuclei, and forming a nitride semiconductor layer containing Ga on the second AlN layer. The forming a first MN layer includes supplying a trimethylaluminum gas, an ammonia gas, and a hydrogen gas into a film formation chamber at a temperature of 1000° C. to 1200° C. The etching a first AlN layer includes partly sublimating the first MN layer by stopping supply of the trimethylaluminum gas into the film formation chamber while maintaining supply of the ammonia gas and the hydrogen gas into the film formation chamber at a temperature of 1000° C. to 1200° C.

A plurality of pieces of AlN seed crystals are formed by forming and etching a first AlN layer. Then, a second AlN layer is formed using the AlN seed crystals as growth nuclei. Thus, crystal defects in the semiconductor layer formed on the second AlN layer can be reduced. In addition, both the forming and the etching of the first AlN layer can be performed in a common film formation chamber, and when ammonia gas is used for the formation of the second AlN layer, the flow rate of ammonia gas can be easily stabilized by continuing the supply of ammonia gas.

Details of Embodiments of the Present Disclosure

Hereinafter, embodiments of the present disclosure will be described in detail, but the present disclosure is not limited thereto. In the specification and the drawings, components having substantially the same function and configuration are denoted by the same reference signs, and redundant description thereof may be omitted.

First Embodiment

Figure 6:
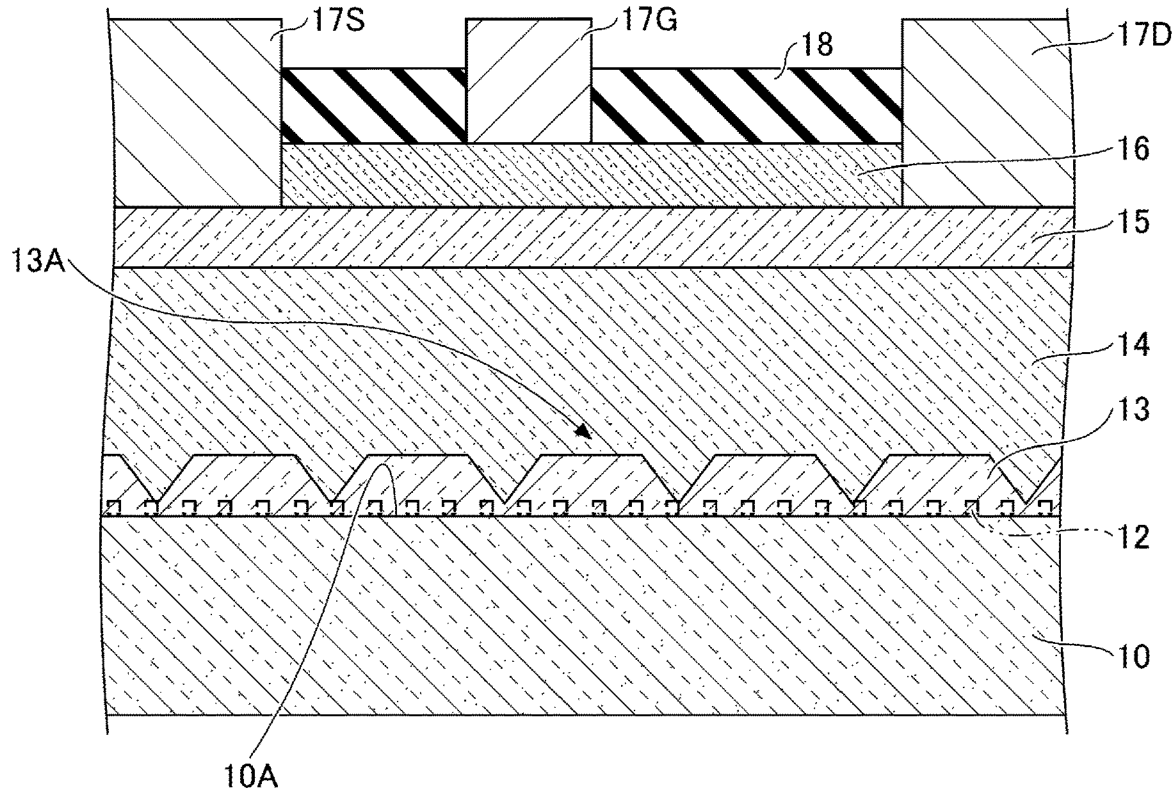
FIG. 6 is a cross-sectional view (part 5) showing the method of manufacturing the semiconductor device according to the first embodiment.
Figure 7:
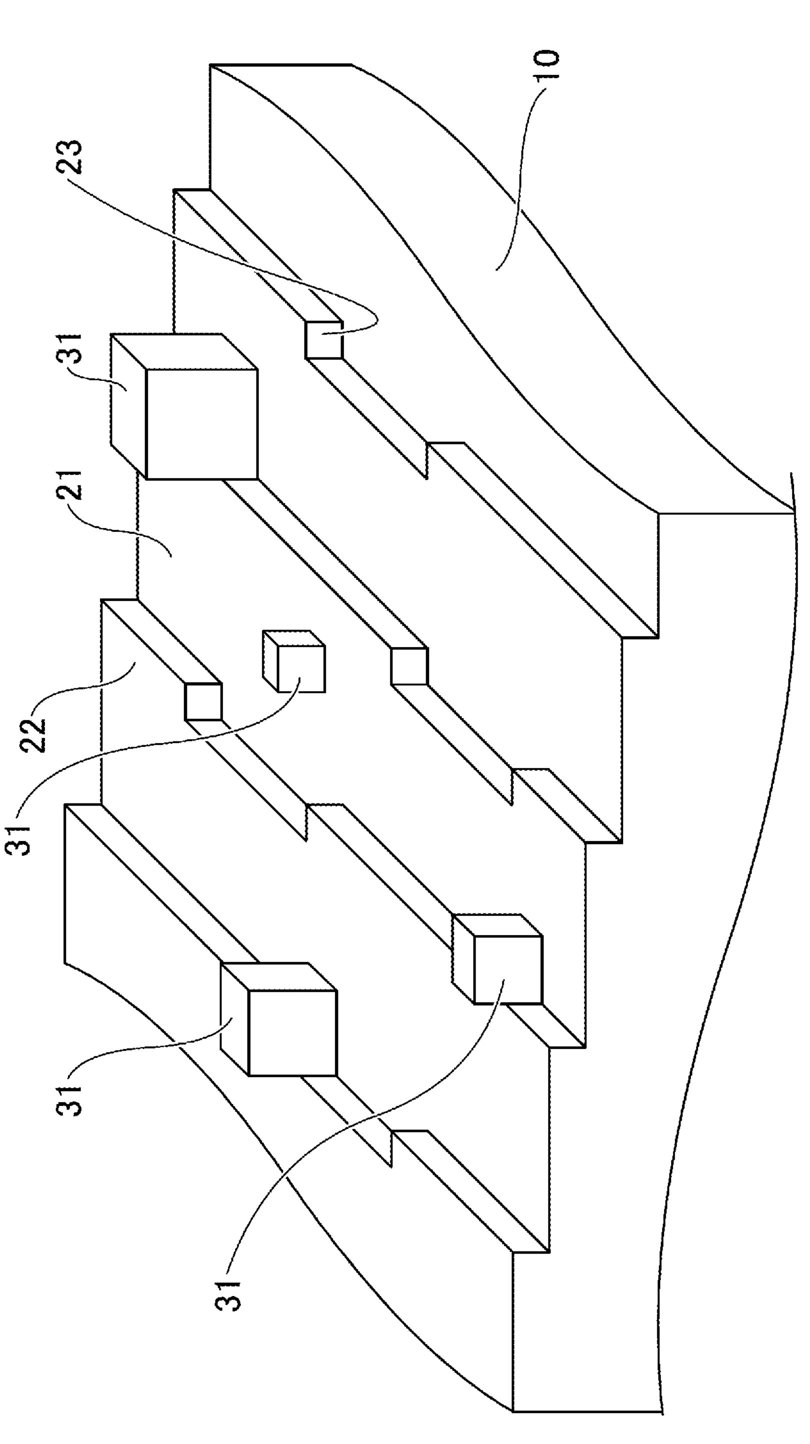
FIG. 7 is a schematic diagram (part 1) showing a formation process of an AlN buffer layer in the first embodiment.
Figure 8:
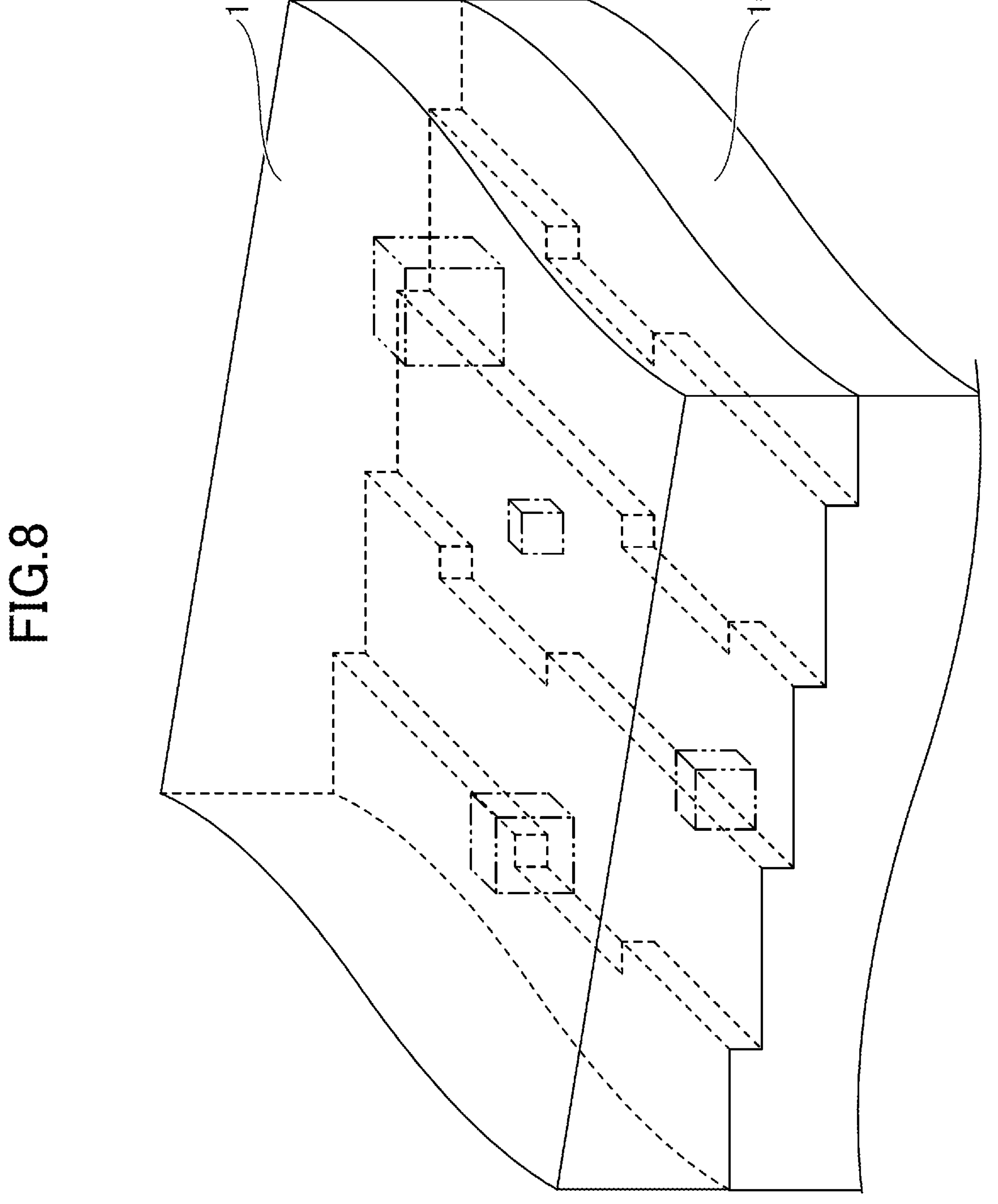
FIG. 8 is a schematic view (part 2) showing the formation process of the AlN buffer layer in the first embodiment.

First, a first embodiment will be described. The first embodiment relates to a method of manufacturing a semiconductor device including a GaN-based high electron mobility transistor (HEMT). FIG. 1 is a flowchart showing a method of manufacturing a semiconductor device according to the first embodiment. FIGS. 2 to 6 are cross-sectional views showing the method of manufacturing the semiconductor device according to the first embodiment. FIGS. 7 to 9 are schematic views showing the formation process of the AlN buffer layer in the first embodiment.

Figure 2:
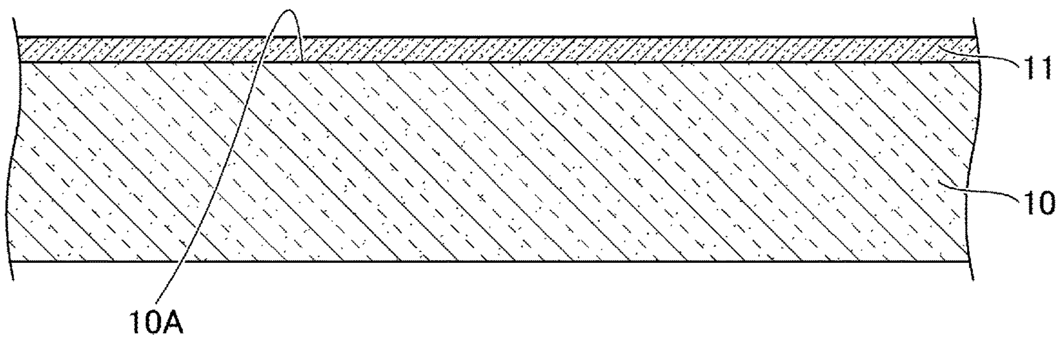
FIG. 2 is a cross-sectional view (part 1) showing the method of manufacturing the semiconductor device according to the first embodiment.

In the first embodiment, first, an SiC single-crystal substrate 10 is placed in a film formation chamber (step S11). Next, as shown in FIG. 2, a first MN layer 11 is formed on an upper surface 10A of SiC single-crystal substrate 10 by, for example, a metal-organic chemical vapor deposition (MOCVD) method (step S12). SiC single-crystal substrate 10 may have an off angle. Upper surface 10A is, for example, a Si surface of an SiC single crystal. First AlN layer 11 is epitaxially grown on upper surface 10A. For example, first AlN layer 11 is formed to cover entire upper surface 10A. The average thickness of first AlN layer 11 may be 1 to 20 nm, or may be 3 to 10 nm. When first AlN layer 11 is formed, for example, trimethylaluminum (TMA) gas, ammonia ($NH_3$) gas, and hydrogen ($H_2$) gas are supplied into a film formation chamber in which SiC single-crystal substrate 10 is accommodated at a temperature of 1000° C. to 1200° C. Upper surface 10A is an example of a first main surface.

As shown in FIG. 7, upper surface 10A of SiC single-crystal substrate 10 includes a terrace 21, a step 22, and a kink 23. Step 22 generally represents a step with a small atomic level height generated during crystal growth, and a relatively flat surface portion of step 22 is called terrace 21. A corner portion of step 22 is referred to as kink 23. Al contained in the TMA gas and N contained in the $NH_3$ gas are combined to form first AlN layer 11, and at an initial stage thereof, nuclei 31 are generated at a plurality of locations on upper surface 10A. A nucleus 31 is likely to be generated at step 22 and kink 23. However, since the TMA gas and the $NH_3$ gas inevitably have unevenness in concentration or upper surface 10A inevitably has unevenness in temperature, it is difficult to control a portion where nucleus 31 is generated. Further, it is difficult to control the size of nucleus 31 to be generated.

Thereafter, when the supply of the TMA gas, the $NH_3$ gas and the $H_2$ gas into the film formation chamber is continued, AlN grows three dimensionally from nucleus 31, and first AlN layer 11 is formed as shown in FIG. 8. In FIG. 8, the upper surface of first AlN layer 11 is illustrated as being flat for convenience, but the upper surface of first MN layer 11 may be uneven.

Figure 3:
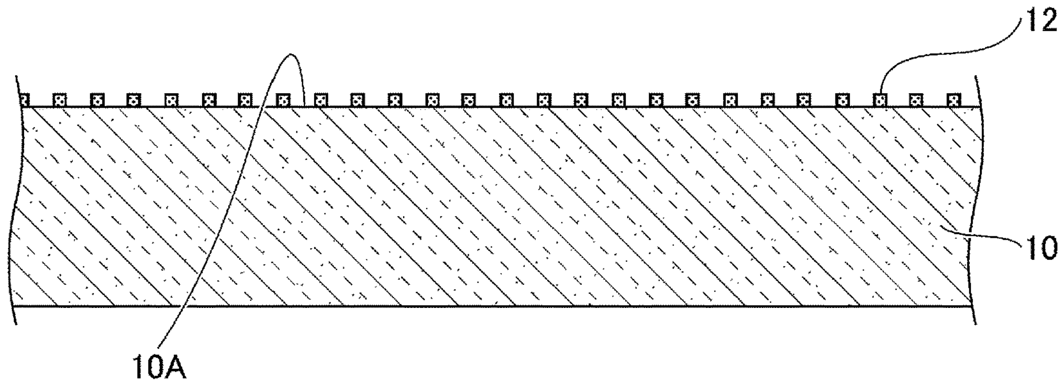
FIG. 3 is a cross-sectional view (part 2) showing the method of manufacturing the semiconductor device according to the first embodiment.

After forming first AlN layer 11, as shown in FIG. 3, part of first AlN layer 11 is etched to form a plurality of pieces of AlN seed crystals 12 on upper surface 10A of SiC single-crystal substrate 10 from first AlN layer 11 (step S13). When etching first AlN layer 11, the supply of the TMA gas into the film formation chamber is stopped while continuing to supply the $NH_3$ gas and the $H_2$ gas into the film formation chamber at a temperature of, for example, 1000° C. to 1200° C. inclusive, thereby sublimating part of first AlN layer 11.

The bonding between AlN constituting first AlN layer 11 and SiC constituting SiC single-crystal substrate 10 is stronger in step 22 and kink 23 than in terrace 21. Thus, when the etching of first MN layer 11 is advanced, as shown in FIG. 9, first AlN layer 11 preferentially remains in steps 22 and kinks 23, and a plurality of pieces of AlN seed crystals 12 are formed. The average height of AlN seed crystals 12 remaining after the etching may be 2.0 times or less the average height of steps 22 present on upper surface 10A, or may be 1.0 times or less the average height of steps 22 present on upper surface 10A. This is because variation in the size of AlN seed crystals 12 remaining after etching can be easily reduced.

Steps 22 and kinks 23 are dispersed in upper surface 10A at a relatively uniform density. Therefore, AlN seed crystals 12 are more likely to be dispersed in upper surface 10A at a more uniform density than nucleus 31. Since AlN seed crystals 12 are preferentially formed at steps 22 and kinks 23, the size of AlN seed crystals 12 is more likely to be uniform than the size of nucleus 31.

Figure 4:
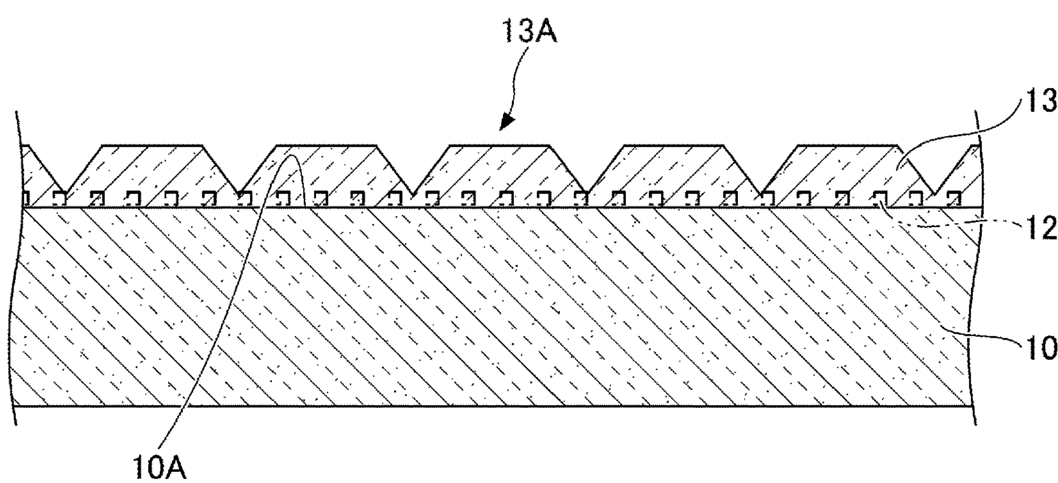
FIG. 4 is a cross-sectional view (part 3) showing the method of manufacturing the semiconductor device according to the first embodiment.

After the formation of AlN seed crystals 12, as shown in FIG. 4, a second AlN layer 13 is formed as an AlN buffer layer on upper surface 10A of SiC single-crystal substrate 10, for example, by MOCVD using AlN seed crystals 12 as growth nuclei (step S14). Second AlN layer 13 is epitaxially grown on upper surface 10A. For example, second AlN layer 13 is grown in an island shape in the Stranski-Krastanov Growth Mode (S-K Growth Mode) growth mode. The average thickness of second AlN layer 13 may be 10 to 30 nm, or may be 10 to 20 nm. When forming the second AlN layer 13, for example, a TMA gas, a $NH_3$ gas, and a $H_2$ gas are supplied into the film formation chamber in which SiC single-crystal substrate 10 is accommodated at a temperature of 1000° C. to 1200° C. inclusive.

Variations in the density and size of AlN seed crystals 12 on upper surface 10A are small, and second AlN layer 13 grows three dimensionally using AlN seed crystals 12 as growth nuclei. Accordingly, variations in density and size among the plurality of protrusions 13A included in second AlN layer 13 grown in an island shape are also small. Each protrusion 13A is formed so as to surround a plurality of pieces of AlN seed crystals 12.

Figure 5:
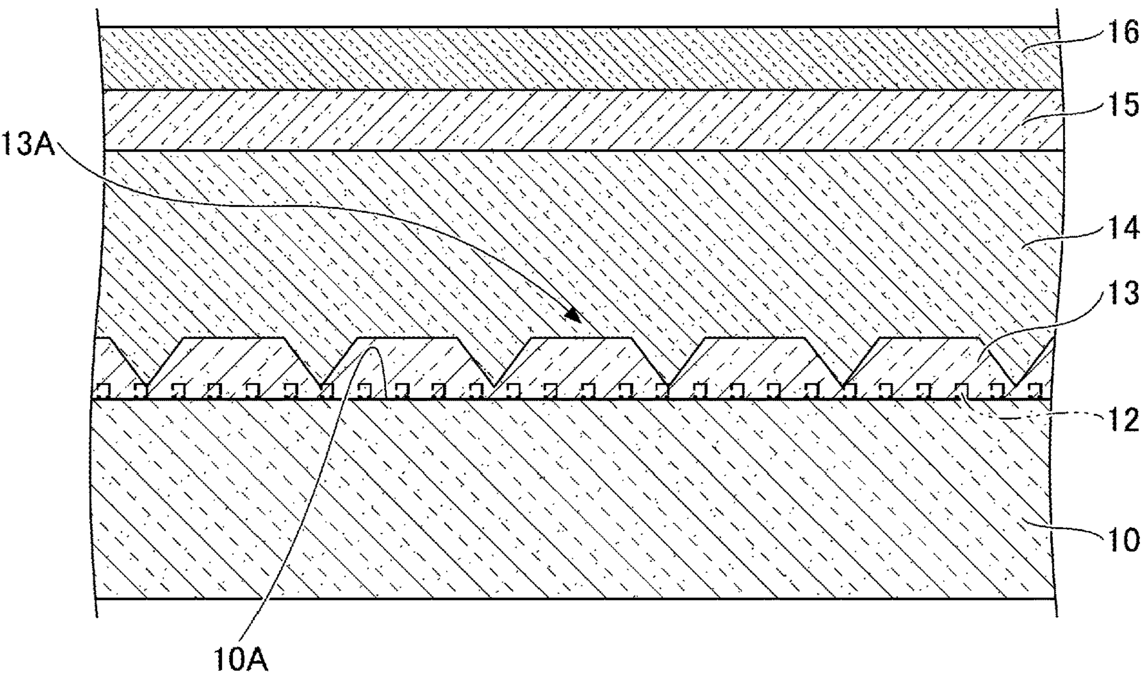
FIG. 5 is a cross-sectional view (part 4) showing the method of manufacturing the semiconductor device according to the first embodiment.

After the formation of second AlN layer 13, as shown in FIG. 5, an electron transit layer 14, an electron supply layer 15, and a cap layer 16 are formed on second AlN layer 13, for example, by MOCVD (step S15). Electron transit layer 14, electron supply layer 15, and cap layer 16 are epitaxially grown on the upper surface of the second MN layer 13. For example, electron transit layer 14 is a GaN layer, electron supply layer 15 is an AlGaN layer, and cap layer 16 is a GaN layer. When electron transit layer 14 and cap layer 16 are formed, for example, trimethylgallium (TMG) gas, $NH_3$ gas, and $H_2$ gas are supplied into the film formation chamber in which SiC single-crystal substrate 10 is accommodated. When electron supply layer 15 is formed, for example, TMA gas, TMG gas, $NH_3$ gas, and $H_2$ gas are supplied into the film formation chamber in which SiC single-crystal substrate 10 is accommodated.

Since variations in density and size among the plurality of protrusions 13A included in second AlN layer 13 are small, electron transit layer 14 can be uniformly grown above upper surface 10A, and dislocations are less likely to occur in electron transit layer 14. Accordingly, occurrence of crystal defects such as pits is suppressed. Similarly, in electron supply layer 15 and cap layer 16, the occurrence of crystal defects such as pits is suppressed.

After cap layer 16 is formed, SiC single-crystal substrate 10 on which second AlN layer 13, electron transit layer 14, electron supply layer 15, and cap layer 16 are formed is taken out of the film formation chamber (step S16). Next, as shown in FIG. 6, a portion of cap layer 16 is removed to form a source electrode 17S and a drain electrode 17D. Further, a gate electrode 17G is formed on cap layer 16. Thereafter, a protecting film 18 covering cap layer 16 is formed (step S17).

In this manner, a semiconductor device including a GaN based HEMT can be manufactured.

In the first embodiment, AlN seed crystal 12 is formed by forming and etching first AlN layer 11. Then, second AlN layer 13 is formed using AlN seed crystals 12 as growth nuclei. Thus, it is possible to suppress variations in density and size among the plurality of protrusions 13A included in second AlN layer 13. Accordingly, crystal defects in electron transit layer 14, electron supply layer 15, and cap layer 16 (nitride semiconductor layer) formed on second MN layer 13 can be reduced.

Further, the processes from the formation of first MN layer 11 to the formation of cap layer 16 can be performed in a single film formation chamber. Thus, these processes can be continuously performed. In addition, it is possible to avoid oxidation or the like associated with unloading to the outside of the film formation chamber.

Figure 10:
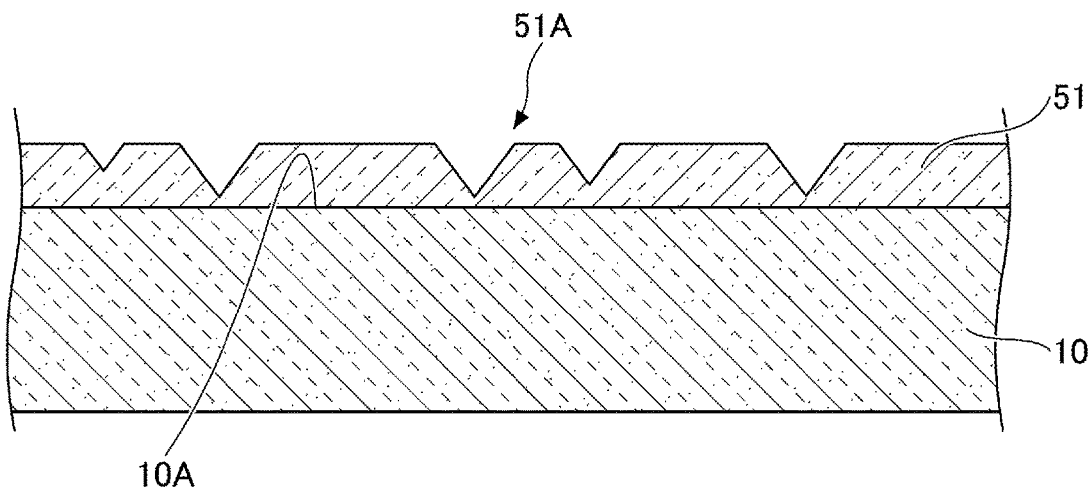
FIG. 10 is a cross-sectional view (part 1) showing a method of manufacturing a semiconductor device according to a reference example.
Figure 11:
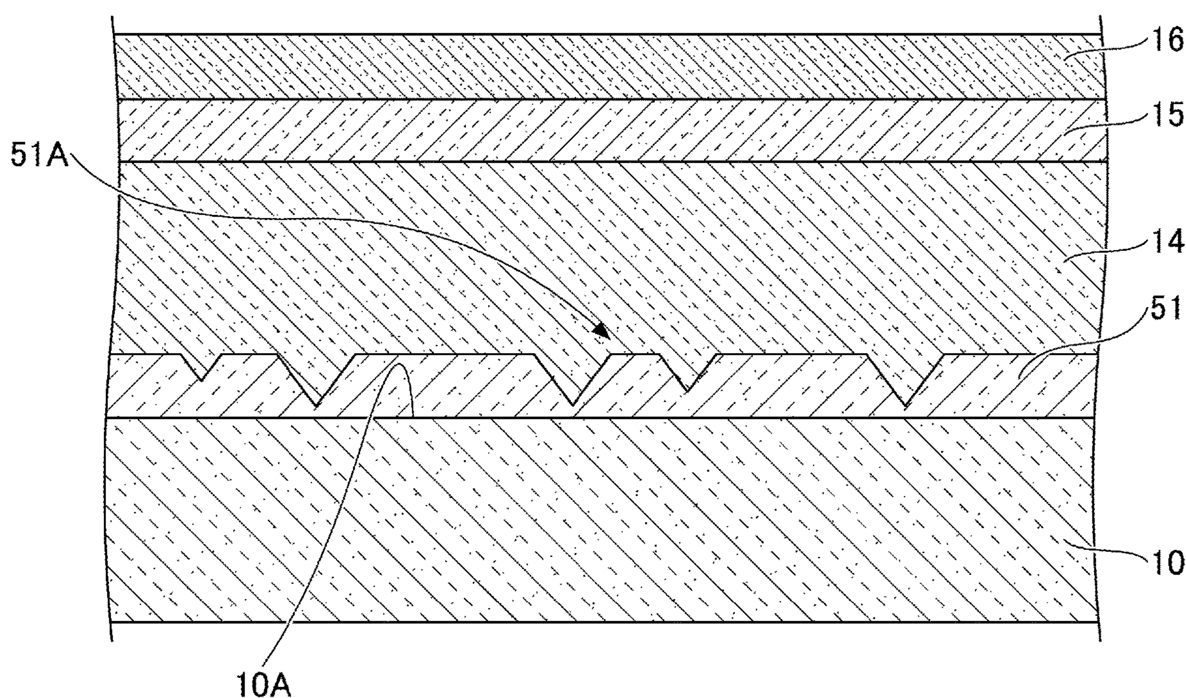
FIG. 11 is a cross-sectional view (part 2) showing the method of manufacturing the semiconductor device according to the reference example.
Figure 12:
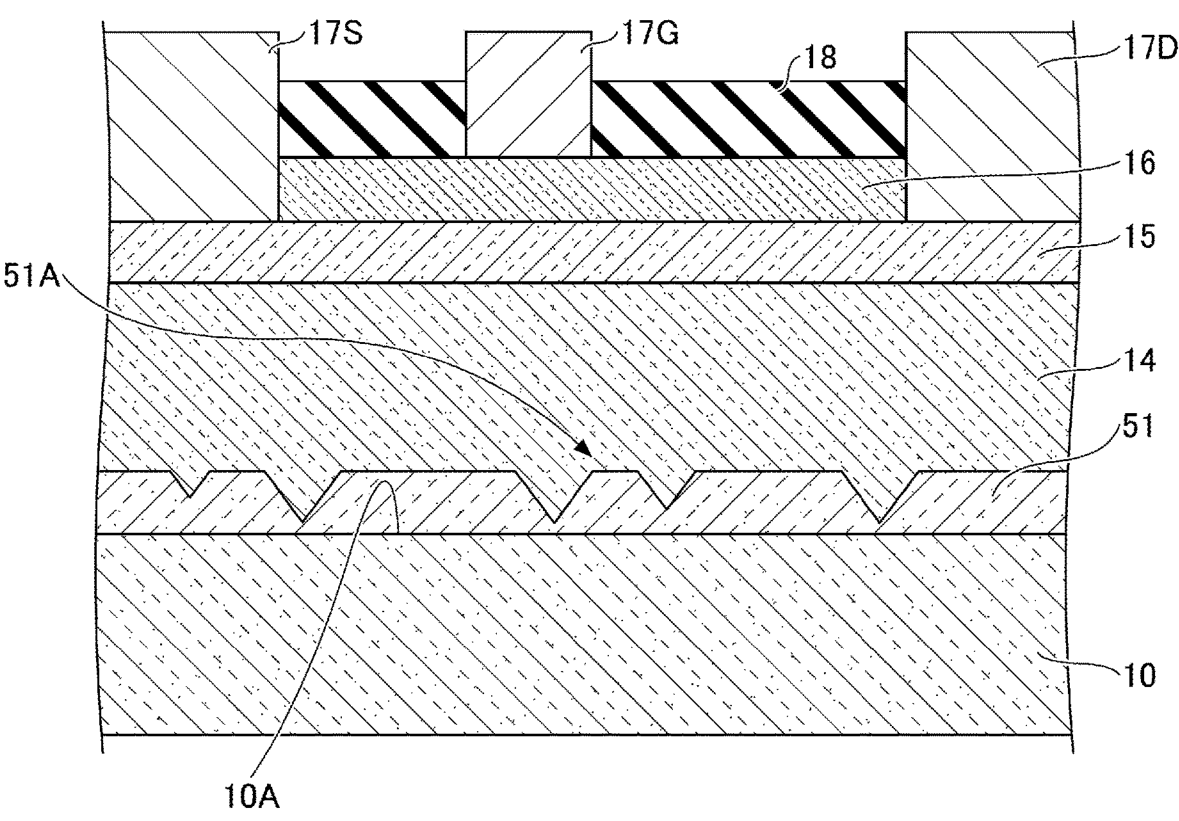
FIG. 12 is a cross-sectional view (part 3) showing the method of manufacturing the semiconductor device according to the reference example.

Here, a comparative example will be described for comparison with the first embodiment. FIGS. 10 to 12 are cross-sectional views showing a method of manufacturing a semiconductor device according to the comparative example.

In the comparative example, as shown in FIG. 10, an AlN layer 51 is formed on upper surface 10A of SiC single-crystal substrate 10 in the same manner as first AlN layer 11. Next, as shown in FIG. 11, electron transit layer 14, electron supply layer 15, and cap layer 16 are formed on MN layer 51. Next, as shown in FIG. 12, similarly to the first embodiment, source electrode 17S, drain electrode 17D, gate electrode 17G, and protecting film 18 are formed.

Although nuclei are generated in the initial stage of the formation of AlN layer 51, it is difficult to control the positions where the nuclei are generated and the size of the nuclei, similarly to nuclei 31 in the initial stage of the formation of first AlN layer 11. Accordingly, the density and the size are likely to vary among the plurality of protrusions 51A included in AlN layer 51. Thus, the number of crystal defects in electron transit layer 14, electron supply layer 15, and cap layer 16 of the semiconductor device manufactured according to the comparative example is greater than that of the semiconductor device manufactured according to the first embodiment. That is, in the first embodiment, it is possible to reduce crystal defects more than in the comparative example.

When first AlN layer 11 is etched, not only the supply of the TMA gas but also the supply of the $NH_3$ gas to the film formation chamber may be stopped. However, since the $NH_3$ gas is supplied when second AlN layer 13 is formed after the etching of first AlN layer 11, the supply of the $NH_3$ gas may be continued from the viewpoint of stabilizing the flow rate of the $NH_3$ gas.

Second Embodiment

Figure 13:
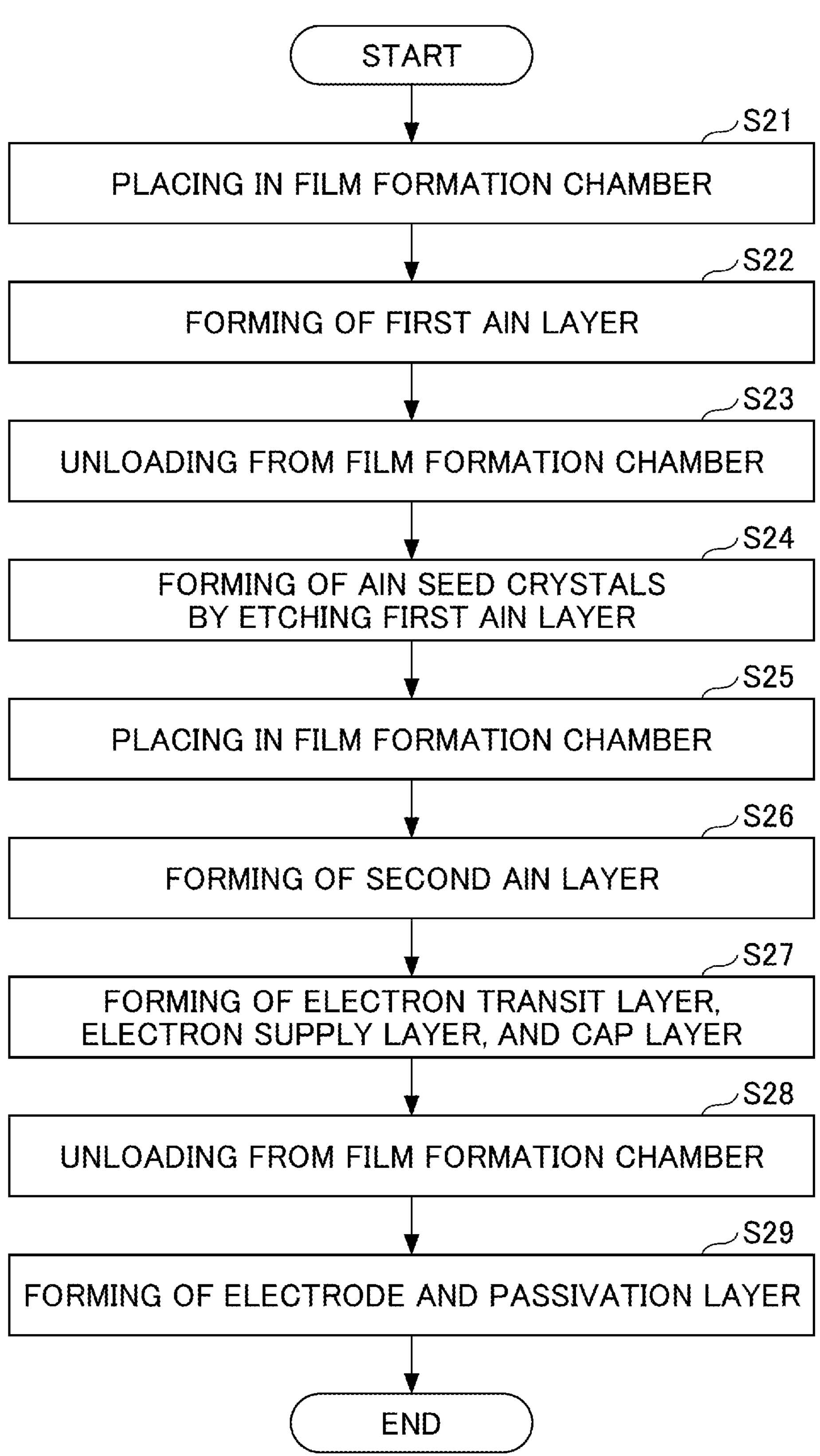
FIG. 13 is a flow chart showing a method of manufacturing a semiconductor device according to a second embodiment.

Next, a second embodiment will be described. The second embodiment is different from the first embodiment mainly in the etching method of first AlN layer 11. FIG. 13 is a flowchart showing a method of manufacturing a semiconductor device according to the second embodiment.

In the second embodiment, first, similarly to steps S11 to S12 of the first embodiment, SiC single-crystal substrate 10 is placed in a film formation chamber (step S21), and first AlN layer 11 is formed (step S22).

Next, SiC single-crystal substrate 10 on which first AlN layer 11 is formed is taken out of the film formation chamber (step S23). Next, a part of first MN layer 11 is etched to form a plurality of pieces of MN seed crystals 12 on upper surface 10A of SiC single-crystal substrate 10 from first AlN layer 11 (step S24). When etching first AlN layer 11, for example, dry etching of first AlN layer 11 is performed using hydrogen chloride (HCl) gas at a temperature of 850° C. to 1100° C. inclusive in an etching apparatus to remove a portion of first AlN layer 11. $H_2$ gas or nitrogen ($N_2$) gas may be used as a carrier gas for HCl gas. In the second embodiment, as shown in FIG. 9, first AlN layer 11 preferentially remains in steps 22 and kinks 23, and a plurality of pieces of AlN seed crystals 12 are formed.

After the formation of AlN seed crystals 12, SiC single-crystal substrate 10 on which AlN seed crystals 12 are formed is again placed in the film formation chamber (step S25). Next, similarly to steps S14 to S15 of the first embodiment, second AlN layer 13 is formed (step S26), and electron transit layer 14, electron supply layer 15, and cap layer 16 are formed (step S27).

Next, similarly to steps S16 to S17 of the first embodiment, SiC single-crystal substrate 10 on which second MN layer 13, electron transit layer 14, electron supply layer 15, and cap layer 16 are formed is taken out of the film formation chamber (step S28), and protecting film 18 is formed (step S29).

In this manner, a semiconductor device including a GaN based HEMT can be manufactured.

In the second embodiment, since second AlN layer 13 is formed using AlN seed crystals 12 as growth nuclei, it is possible to suppress variations in density and size among the plurality of protrusions 13A included in second AlN layer 13. Thus, crystal defects in electron transit layer 14, electron supply layer 15, and cap layer 16 (nitride semiconductor layer) formed on second AlN layer 13 can be reduced.

Further, since dry etching using HCl gas is performed as etching of first AlN layer 11, AlN seed crystal 12 can be formed in a short time.

The inventors of the present application formed electron transit layers 14 of GaN according to the second embodiment and the comparative example described above, and measured the number densities of pits in these electron transit layers 14. As a result, the number density in the second embodiment was about 1/40 to 1/30 of that in the comparative example.

Note that the single-crystal substrate is not limited to an SiC single-crystal substrate, and, for example, an AlN single-crystal substrate, a GaN single-crystal substrate, a sapphire single-crystal substrate, a Si single-crystal substrate, or the like may be used.

Although the embodiments have been described in detail above, the present invention is not limited to the specific embodiments, and various modifications and changes can be made within the scope described in the claims.

What is claimed is:

1. A method of manufacturing a semiconductor device, the method comprising:

forming a first AlN layer on a first main surface of a single-crystal substrate;

etching the first AlN layer without using a mask to form a plurality of pieces of AlN seed crystals on the first main surface from the first AlN layer only by sublimating the first AlN layer without using a mechanical process; and forming a second AlN layer on the first main surface using the AlN seed crystals as growth nuclei, after etching the first AlN layer, wherein the forming of the first AlN layer includes supplying a trimethylaluminum gas, an ammonia gas, and a hydrogen gas into a film formation chamber, and wherein the etching of the first AlN layer includes partly sublimating the first AlN layer by stopping supply of the trimethylaluminum gas into the film formation chamber while maintaining supply of the hydrogen gas into the film formation chamber at a temperature of 1000° C. to 1200° C. inclusive.

2. The method of manufacturing a semiconductor device according to claim 1, the method comprising forming a nitride semiconductor layer containing Ga on the second AlN layer.

3. The method of manufacturing a semiconductor device according to claim 1, wherein in the forming a first AlN layer, the first main surface is entirely covered with the first AlN layer.

4. The method of manufacturing a semiconductor device according to claim 1, wherein in the etching the first AlN layer, supply of the ammonia gas into the film formation chamber is maintained while maintaining supply of the hydrogen gas.

5. The method of manufacturing a semiconductor device according to claim 1, wherein an average height of the AlN seed crystals is 2.0 times or less than an average height of a step present on the first main surface.

6. The method of manufacturing a semiconductor device according to claim 1, wherein the single-crystal substrate is an SiC single-crystal substrate.

7. A method of manufacturing a semiconductor device, the method comprising:

forming a first AlN layer on a first main surface of an SiC single-crystal substrate;

etching the first AlN layer without using a mask to form a plurality of pieces of AlN seed crystals on the first main surface from the first AlN layer only by sublimating the first AlN layer without using a mechanical process;

forming a second AlN layer on the first main surface using the AlN seed crystals as growth nuclei, after etching the first AlN layer; and forming a nitride semiconductor layer containing Ga on the second AlN layer, wherein the forming a first AlN layer includes supplying a trimethylaluminum gas, an ammonia gas, and a hydrogen gas into a film formation chamber at a temperature of 1000° C. to 1200° C. inclusive, and wherein the etching a first AlN layer includes partly sublimating the first AlN layer by stopping supply of the trimethylaluminum gas into the film formation chamber while maintaining supply of the ammonia gas and the hydrogen gas into the film formation chamber at a temperature of 1000° C. to 1200° C. inclusive.

* * * * *